(12) United States Patent
Chen et al.

(10) Patent No.: US 6,448,765 B1
(45) Date of Patent: Sep. 10, 2002

(54) MICROSCOPIC TIPS HAVING STABLE MAGNETIC MOMENTS AND DISPOSED ON CANTILEVERS FOR SENSING MAGNETIC CHARACTERISTICS OF ADJACENT STRUCTURES

(75) Inventors: Hong Chen; Chester Xiaowen Chien, both of San Jose, CA (US)

(73) Assignee: Read-Rite Corporation, Fremont, CA (US)

( * ) Notice: Subject to any disclaimer, the term of this patent is extended or adjusted under 35 U.S.C. 154(b) by 0 days.

(21) Appl. No.: 09/429,783

(22) Filed: Oct. 28, 1999

(51) Int. Cl.$^7$ ............................................. G01R 33/02
(52) U.S. Cl. ..................................................... 324/244
(58) Field of Search ................................. 324/228, 244, 324/252, 260, 261, 262; 250/306, 307

(56) References Cited

U.S. PATENT DOCUMENTS 5,754,516 A * 5/1998 Daval et al. ................. 369/126
5,856,617 A * 1/1999 Gurney et al. ............... 324/252
6,121,771 A * 9/2000 Moser .......................... 324/244

OTHER PUBLICATIONS

K. Sueoka et al.,, "Direct Measurement of the Sensitivity Distribution of Magnetoresistive Heads by the SXM Technique," IEEE Transactions on Magnetics, vol. 28, No. 5, Sep. 1992, pp. 2307–2309.

G. A. Gibson et al., "Spatial Mapping of the Sensitivity Function of Magnetic Recording Heads Using a Magnetic Force Microscope as a Local Flux Applicator," IEEE Transactions on Magnetics, vol. 28, No. 5, Sep. 1992, pp. 2310–2311.

K. Babcock et al., "Optimization of Thin–Film Tips for Magnetic Force Microscopy," IEEE Transactions on Magnetics, vol. 30, No. 6, Nov. 1994, pp. 4503–4505D.

Streblechenko et al., "Quantitative Magnetometry Using Electron Holography: Field profiles Near Magnetic Force Microscope Tips," IEEE Transactions on Magnetics, vol. 32, No. 5, Sep. 1996, pp. 4124–4129.

C. X. Qian et al., "Characterization of High Density Spin Valve Recording Heads by Novel Magnetic Force Microscope," IEEE Transactions on Magnetics, vol. 35, No. 5, Sep. 1999, pp. 2625–2627.

* cited by examiner

Primary Examiner—Jay Patidar
(74) Attorney, Agent, or Firm—Mark Lauer

(57) ABSTRACT

A magnetic force microscope (MFM) needle has a magnetic material with a magnetic moment that is pinned in a preferred direction. The magnetic moment can be of lower than conventional magnitude without risking an undesirable change in the direction of magnetization. The magnetic needle can have a ferromagnetic layer (or layers) that is stabilized by an antiferromagnetic layer (or layers). The needle can be employed as a magnetoresistance sensitivity microscope (MSM) to map the sensitivity of a magnetic sensor, such as a magnetoresistive (MR) or giant magnetoresistive (GMR) sensor. Alternatively, the needle can be employed in measuring magnetic fields, such as with a high frequency magnetic force microscope (HFMFM).

20 Claims, 4 Drawing Sheets

MICROSCOPIC TIPS HAVING STABLE MAGNETIC MOMENTS AND DISPOSED ON CANTILEVERS FOR SENSING MAGNETIC CHARACTERISTICS OF ADJACENT STRUCTURES

TECHNICAL FIELD

This invention relates to microscopic needles having magnetic characteristics that may be used for measurement and testing.

BACKGROUND OF THE INVENTION

A conventional atomic force microscope (AFM) includes a microscopic needle formed on the free end of a spring-like cantilever, and provides a topographic map of a specimen surface by detecting a repulsive or attractive force acting on the needle. In order to measure or map at high resolution the AFM needle must be sharp, requiring that a tip of the needle have a small radius of curvature.

A scanning tunneling microscope (STM) allows observation of conductive surfaces, by flowing current between a microscopic conductive tip and the conductive surface. This current is very sensitive to a change in distance between the tip and the conductive material, and changes exponentially according to that distance. By scanning the tip along a straight line or flat plane, the surface structure can be observed at an atomic order resolution. Surfaces that can be scanned using STM are typically limited to conductive materials, although thin insulating layers overlying conductive materials can also be analyzed.

A magnetic force microscope (MFM) utilizes a magnetized microscopic tip held on a free end of a cantilever to measure a magnetic field of an object by detecting the magnetic force acting between the object and the tip. A MFM can thus provide two or three-dimensional mapping of various magnetic fields of the object. In addition to structural evaluation of a sample, applicability of MFM to an information storing apparatus which records or reads information directly in a magnetic recording medium using the magnetic field of the tip has been proposed.

Instead of mapping the magnetic field of an object by measuring deflection of a MFM cantilever, the MFM tip can be used to provide a magnetic field to a magnetic sensor for measuring the performance of the sensor. A magnetoresistance sensitivity microscope (MSM) uses a MFM tip to map the sensitivity of a magnetoresistive (MR) sensor, such as may be employed in a disk or tape drive system. The MSM tip may oscillate while a phase lock-in detector measures the electric signal across the sensor at the tip oscillation frequency. Alternatively, the magnetic tip employed in the MFM can also b e used as the field sensor to detect a high frequency magnetic field modulated with the tip oscillation frequency, thus forming a high frequency magnetic force microscope (HFMFM). MSM and HFMFM are discussed in an article entitled "Characterization of >10 Gb/in$^2$ GMR Spin Valve Recording Heads by Novel Magnetic Force Microscope," C. X. Qian et al., IEEE Transactions on Magnetics, Sep. 1999, incorporated herein by reference.

In order to obtain high resolution mapping of a MR or GMR sensor, the MFM tip may be located less than 100 nm from the sensor. At that distance, the MFM needle may provide an excessive magnetic field to the sensor that prevents accurate measurement of sensor performance. In addition, the field from the sensor or nearby magnetic elements may redirect or reverse the magnetization of the MFM needle. A conventional MFM needle can be made with a smaller magnetic moment by reducing the amount of magnetic material disposed on the needle. Forming a needle with less magnetic material, however, may exacerbate the problem of reversal of needle magnetization.

SUMMARY OF THE INVENTION

The present invention overcomes this dilemma by providing a MFM needle with a more stable magnetic moment. This magnetic moment can optionally be reduced in magnitude without risking an undesirable change in magnetization direction. Such an improved magnetic needle may include a magnetic layer (or layers) that produces the magnetic field and a pinning layer (or layers) that stabilizes the direction of the field-producing magnetic layer. The stabilization can be provided by a pinning mechanism between a ferromagnetic layer and an antiferromagnetic structure. For an embodiment in which the magnetic moment of the needle is reduced, saturation of a MR or GMR sensor by the magnetic field from the needle can be avoided, enhancing resolution in mapping that sensor by MSM. A needle having a smaller yet more stable magnetization can also be disposed closer to a magnetic element being mapped without reversing the needle magnetization. In addition, a needle with a small yet stable magnetic moment can be advantageously employed as a sensor, for instance in HFMFM mapping of high strength magnetic fields that would saturate and/or re-magnetize a conventional needle. Difficulties in producing needles having a desired magnetic direction are also reduced by the present invention. Moreover, advantages of the present invention can work in concert for improving MFM performance in various applications.

DETAILED DESCRIPTION OF THE PREFERRED EMBODIMENT

Figure 1:
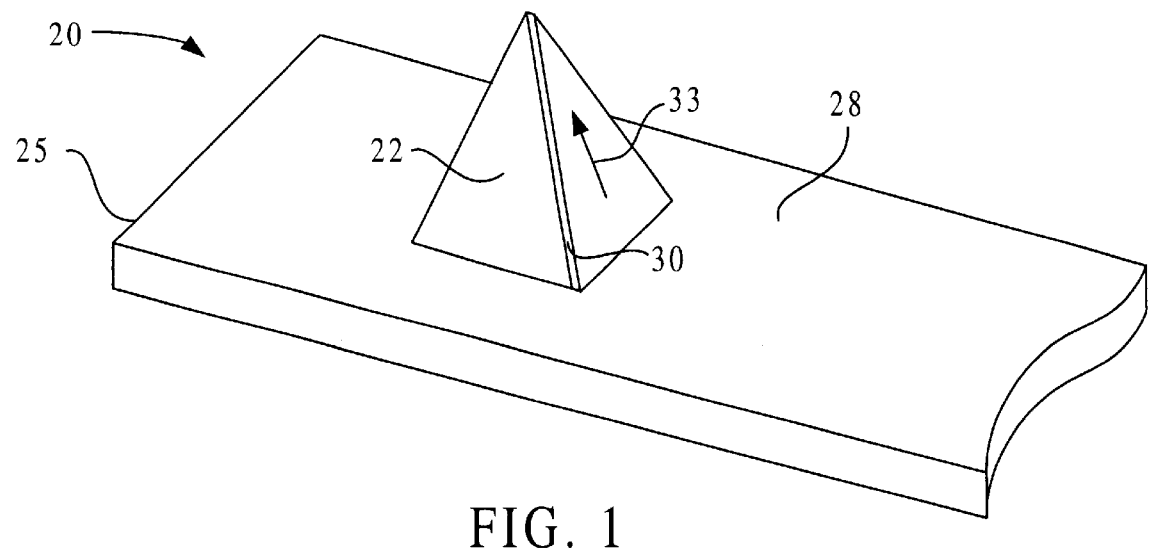
FIG. 1 is a perspective view of cantilever with a microscopic needle having a stable magnetic moment.

FIG. 1 shows an improved MFM 20 of the present invention including a needle 22 disposed near a free end 25 of a cantilever 28. The needle 22 contains a magnetic portion 30 having a stable magnetization direction 33. The magnetic portion 30 may be formed of plural layers, such as an antiferromagnetic layer and a ferromagnetic layer. Interactions between the antiferromagnetic and ferromagnetic layers pin the magnetic moment of the ferromagnetic layer in the direction 33. The cantilever and needle supporting the magnetic layer 30 may be formed of silicon, for example, and may be a commercially available AFM needle having a submicron radius of curvature at the tip.

Figure 2:
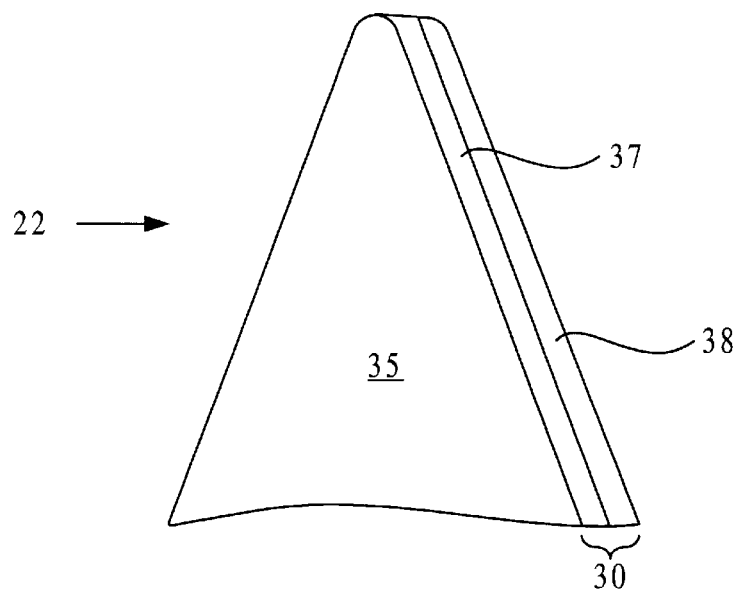
FIG. 2 is a cross-sectional view of a tip of the needle FIG. 1.

FIG. 2 shows an expanded cross-section of the needle 22 of FIG. 1. A silicon tip 35 has an antiferromagnetic layer 37 such as IrMn, for example, coating a side of the tip. A hard magnetic layer 38 containing CoFe, for instance, adjoins the antiferromagnetic layer 37. The magnetic layer 38 can be magnetized in a desired direction by heating the magnetic layer sufficiently to allow an applied magnetic field to orient the magnetization as the temperature is reduced, causing portion 30 to retain a stable magnetic moment. A magnetic field at the tip may be in a range between about 10 Oe and 200 Oe.

Figure 3:
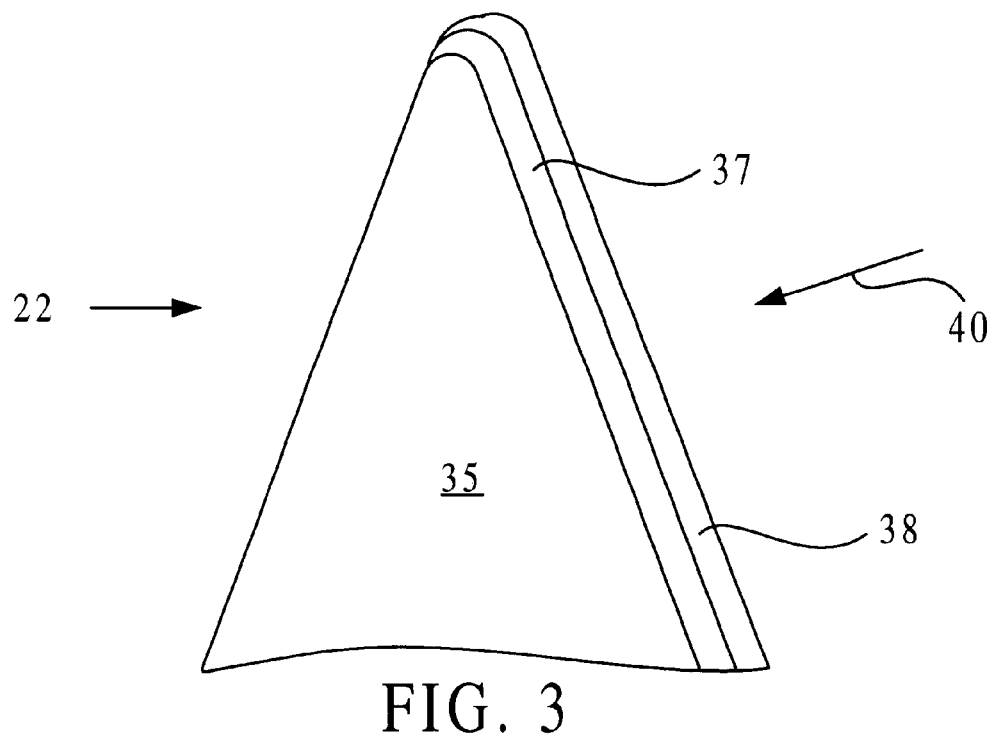
FIG. 3 shows some initial steps in forming the tip of FIG. 2.

Beginning with FIG. 3 some steps in forming the needle 22 are shown. On a side of the silicon tip 35 the layer 37 of antiferromagnetic material is formed, for example, by sputtering or ion beam deposition in the direction of arrow 40. The thickness of the antiferromagnetic layer 37 can be well controlled and may be in a range between about 50 Å and 300 Å. Various materials may be used to form layer 37, including FeMn, NiMn, and IrMn. The layer 38 of ferromagnetic material is then similarly formed, and may contain Fe, Co, CoPt or Ni.

The order of formation of ferromagnetic layer 38 and pinning layer 37 can alternatively be reversed. Whether the ferromagnetic layer 38 or pinning layer 37 is formed first can be determined by consideration of layer adhesion to the substrate such as silicon tip 35 and the desired net pinning strength of total structure.

In conjunction with the choice of ferromagnetic material, the thickness of magnetic layer 38 is important in creating the magnetic field of the needle, and so this thickness may be optimized for the desired use of the MFM 20. For most applications, the thickness of ferromagnetic layer 38 may be in a range between about 200 Å and 1000 Å. For use in mapping the sensitivity of a giant magnetoresistive (GMR) sensor, a 20 Å-thick to 50 Å-thick layer of CoPt adjoining a 90 Å-thick layer of IrMn can be effective.

Figure 4:
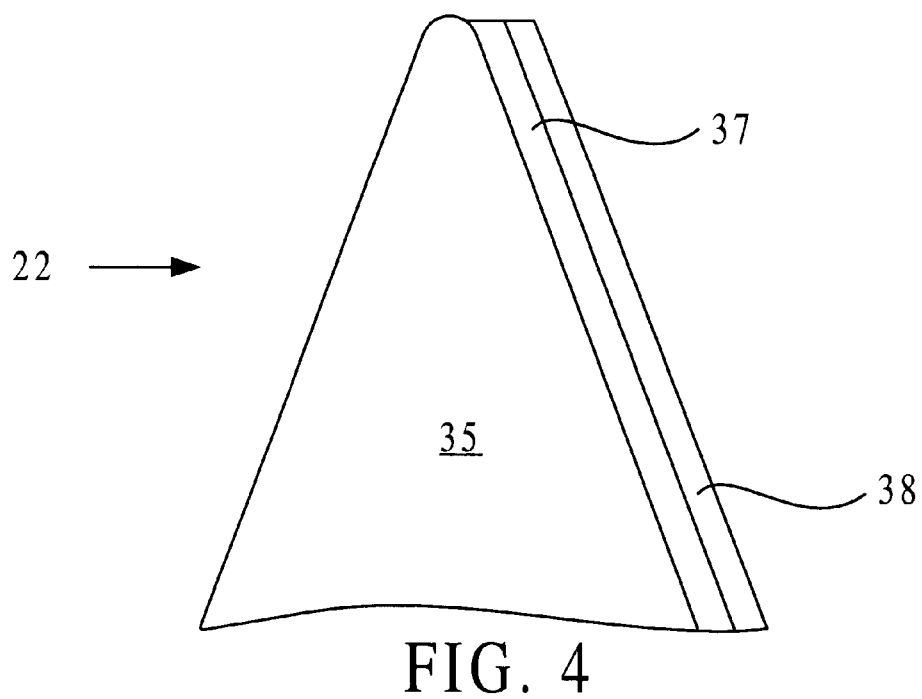
FIG. 4 shows some subsequent steps in forming the tip of FIG. 2.

FIG. 4 shows the needle 22 after trimming of layers 37 and 38 by focused ion beam etching (FIB), reactive ion etching or the like. As is well known, FIB-etching can selectively remove materials in an area with dimensions as small as 50 Å by bombarding the area to be etched with a tightly focused Ga ion beam.

After trimming, the tip is heated to a temperature that randomizes the magnetization of the layer 38, and an external magnetic field is applied in a desired direction, causing the layer to be magnetized in that direction upon cooling.

Figure 5:
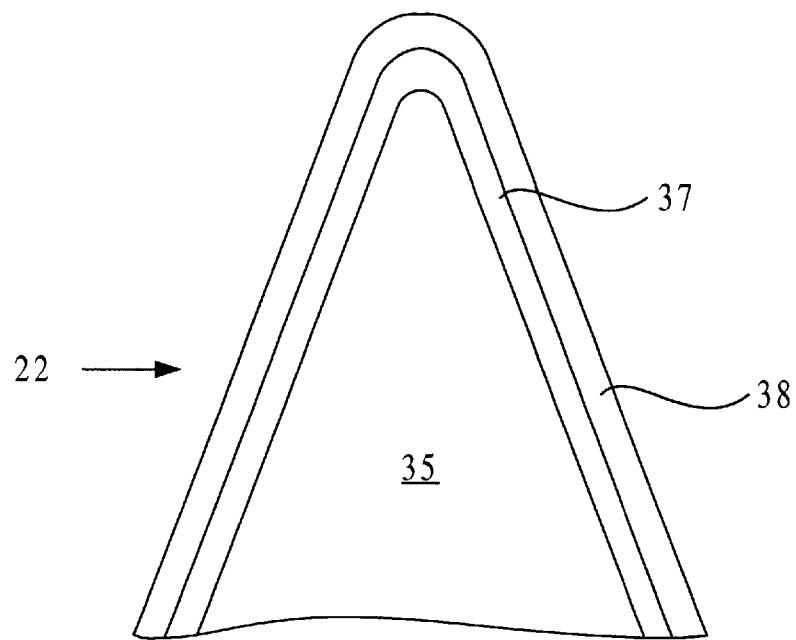
FIG. 5 is a cross-sectional view of a tip of a needle with ferromagnetic and antiferromagnetic layers extending over the tip.
Figure 6:
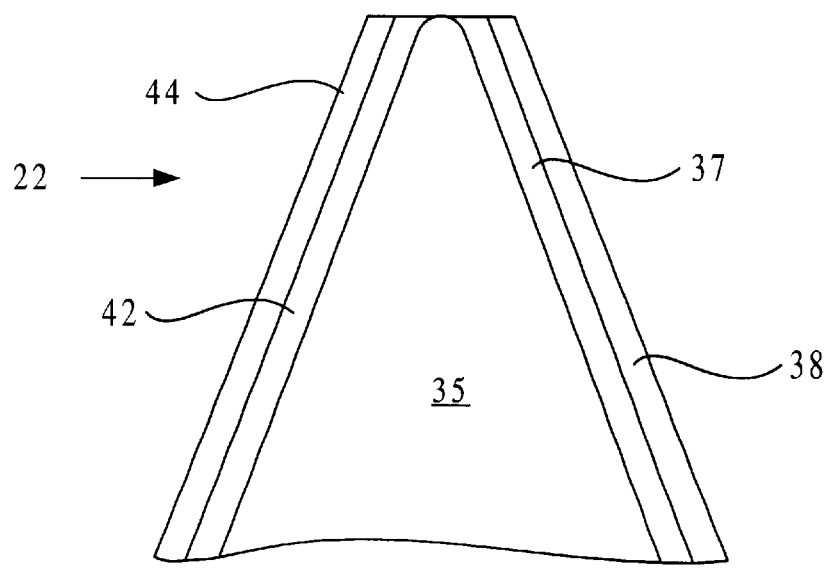
FIG. 6 is a cross-sectional view of a tip of a needle with ferromagnetic and antiferromagnetic layers terminating at the tip.

Other means for forming the stable MFM of the present invention are possible. For example, the needle 22 can be coated on more than one side with ferromagnetic and antiferromagnetic layers, as shown in FIG. 5 and FIG. 6. In this case the layers can terminate at the tip, as shown in FIG. 6, or extend contiguously over the tip, as shown in FIG. 5. In FIG. 6 a second antiferromagnetic layer 42 and a second ferromagnetic layer 44 are disposed on an opposite side from layers 37 and 38. Such plural layers may form either a more directed or more stable magnetic structure, depending upon whether the magnetization of one layer is substantially parallel or substantially antiparallel with that of the other layer.

Figure 7:
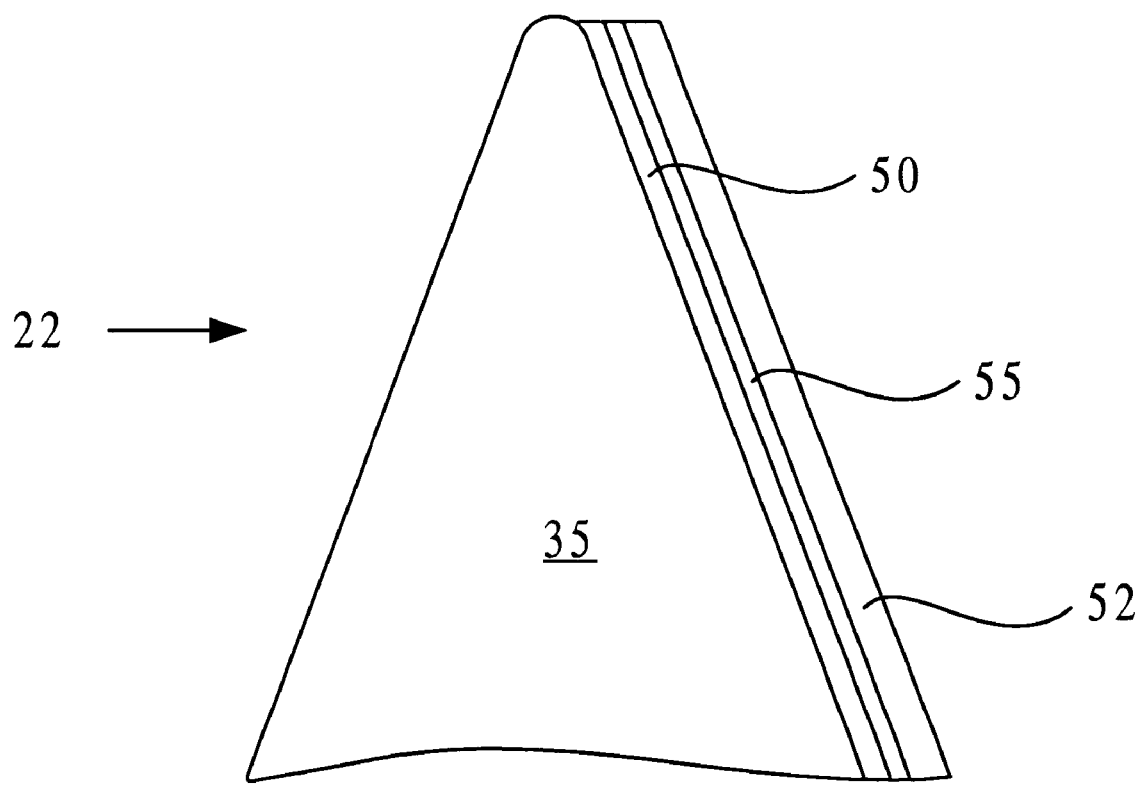
FIG. 7 is a cross-sectional view of a tip of a needle with plural ferromagnetic layers sandwiching a nonmagnetic layer.

Plural ferromagnetic layers 50 and 52 can be formed on a side of a needle, as shown in FIG. 7, sandwiching a nonmagnetic layer 55 such as ruthenium (Ru), copper (Cu) or chromium (Cr) which may have a thickness ranging between about 6 Å and 5 Å. This structure can have magnetically coupled antiparallel ferromagnetic layers with a net magnetic field dependent upon differences in thickness between the ferromagnetic layers, affording provision of a smaller yet more stable field. An antiferromagnetic layer can also be coupled to one of the ferromagnetic layers.

On the other hand, the needle can be formed in a mold by deposit of ferromagnetic and antiferromagnetic layers that are later released. In this case, antiferromagnetic material can optionally form the bulk of the tip substrate rather than an outer layer.

Although we have focused on teaching the preferred embodiments, other embodiments and modifications of this invention will be apparent to persons of skill in the art in view of these teachings. Therefore, this invention is to be limited only by the following claims, which include all such embodiments and modifications when viewed in conjunction with the above specification and accompanying drawings.

What is claimed is:

1. A device comprising:
   a cantilever having a free end,
   a microscopic needle attached to said cantilever adjacent said free end, said needle including a ferromagnetic portion having a magnetic moment and a stabilizing portion adjoining said ferromagnetic portion and pinning said magnetic moment,
   whereby said device is adapted to sense a magnetic characteristic of an object separated from said needle.

2. The device of claim 1 wherein said ferromagnetic portion includes a layer of ferromagnetic material.

3. The device of claim 1 wherein said stabilizing portion includes a layer of antiferromagnetic material.

4. The device of claim 1 wherein at least one of said portions includes a plurality of layers.

5. The device of claim 1 wherein at least one of said portions has a tapered shape.

6. The device of claim 1 wherein said ferromagnetic portion includes a plurality of ferromagnetic layers, and said stabilizing portion includes a nonmagnetic layer having a thickness less than 20 Å.

7. The device of claim 1 wherein said ferromagnetic portion includes a ferromagnetic layer and said stabilizing portion includes an antiferromagnetic layer, wherein said ferromagnetic layer is disposed on said antiferromagnetic layer.

8. The device of claim 1 wherein said needle has a tip with a submicron radius of curvature.

9. The device of claim 1 wherein said object is a sensor.

10. A device for sensing a magnetic field, the device comprising:
    a cantilever having a free end,
    a microscopic needle disposed on said cantilever adjacent said free end and containing a layer of antiferromagnetic material and a layer of ferromagnetic material, said layer of ferromagnetic material adjoining said layer of antiferromagnetic material, wherein said layer of ferromagnetic material has a magnetic direction pinned by said layer of antiferromagnetic material,
    whereby said device is adapted to sense a magnetic characteristic of an object separated from said needle.

11. The device of claim 10 wherein said needle has a tip with a submicron radius of curvature.

12. The device of claim 1 wherein said cantilever is a beam.

13. The device of claim 10 wherein said layer of ferromagnetic material has a thickness less than about 50 Å.

14. The device of claim 10 wherein said layer of ferromagnetic material is disposed on said layer of antiferromagnetic material.

15. The device of claim 10 wherein said layer of antiferromagnetic material is disposed on said layer of ferromagnetic material.

16. The device of claim 10 wherein said needle has a first side and a second side and said layer of antiferromagnetic material is disposed on said first side and a second layer of antiferromagnetic material is disposed on said second side.

17. The device of claim 10 wherein said needle has a tip and a magnetic field at said tip is in a range between about 10 Oe and 200 Oe.

18. A device for sensing a magnetic field, the device comprising:

a cantilever having a free end, a microscopic needle disposed on said cantilever adjacent said free end, said needle containing a section of ferromagnetic material disposed distal to said cantilever and having a magnetic moment, and said needle containing means for stabilizing said magnetic moment, whereby said device is adapted to sense a magnetic characteristic of an object separated from said needle.

19. The device of claim 18 wherein said means for stabilizing said magnetic moment includes a section of antiferromagnetic material.

20. The device of claim 18 further comprising a second section of ferromagnetic material.

\* \* \* \* \*